United States Patent [19]

Shigeta et al.

[11] Patent Number: 5,268,781
[45] Date of Patent: Dec. 7, 1993

[54] LIQUID CRYSTAL DISPLAY DEVICE WITH HOMEOTROPIC ALIGNMENT LAYER UNDERCOAT FORMED BY ION BEAM ASSISTED VAPOR DEPOSITION OF OXIDE GAS

[75] Inventors: Masanobu Shigeta; Tadayuki Shimada, both of Yokosuka; Masanao Asami, Yokohama; Hiroyuki Natsuhori, Kamakura; Shigeo Shimizu, Yokohama; Toshio Konno, Tokyo, all of Japan

[73] Assignee: Victor Company of Japan, Ltd., Yokohama, Japan

[21] Appl. No.: 972,521

[22] Filed: Nov. 6, 1992

[30] Foreign Application Priority Data

Nov. 8, 1991 [JP] Japan .................. 3-321026
Sep. 25, 1992 [JP] Japan .................. 4-280954

[51] Int. Cl.$^5$ .................. G02F 1/1333; G02F 1/1337
[52] U.S. Cl. .................. 359/76; 359/74; 359/79
[58] Field of Search .................. 359/76, 77, 74

[56] References Cited

U.S. PATENT DOCUMENTS

| | | |
|---|---|---|
| 4,153,529 | 5/1979 | Little et al. .................. 204/192 E C |
| 4,357,374 | 11/1982 | Ogawa .................. 359/77 |
| 4,705,359 | 11/1987 | Amstutz et al. .................. 359/76 |
| 4,776,674 | 10/1988 | Filas et al. .................. 359/77 |
| 4,897,290 | 1/1990 | Teresaka et al. .................. 359/76 |

FOREIGN PATENT DOCUMENTS

| | | |
|---|---|---|
| 52-70853 | 6/1977 | Fed. Rep. of Germany ........ 359/76 |
| 2817348 | 10/1978 | Fed. Rep. of Germany ........ 359/76 |
| 2413735 | 7/1979 | France . |
| 51-129251 | 11/1976 | Japan . |
| 55-13338 | 4/1980 | Japan . |
| 56-019030 | 2/1981 | Japan .................. 359/76 |
| 56-137330 | 10/1981 | Japan .................. 359/76 |
| 56-155923 | 12/1981 | Japan .................. 359/76 |
| 57-54919 | 4/1982 | Japan .................. 359/77 |

OTHER PUBLICATIONS

Wilson et al., "Alignment of liquid crystals on surfaces with films deposited obliquely at low and high rates," Mol. Cryst. Liq. Cryst., vol. 94, (1983), pp. 359-366.
Rousille et al., "Liquid crystal quasihomeotropic orientation induced by a polymer deposited on a SiO surface," J. Appl. Phys., vol. 50, No. 6, (Jun. 1979), pp. 3975-3977.
"Homeotropic-Alignment Full-Color LCD" by S. Yamauchi et al., SID 89 DIGEST; pp., 378-381 (1989).
"Photostable Tilted-Perpendicular Alignment of Liquid Crystals for Light Valves"; Anna M. Lackner et al.; Proceedings of the SID, vol. 31/4, 1990; fpp. 321-326.

*Primary Examiner*—William L. Sikes
*Assistant Examiner*—Anita Pellman Gross
*Attorney, Agent, or Firm*—Pollock, Vande Sande & Priddy

[57] ABSTRACT

A homeotropic-alignment liquid crystal display device having a high photostability and a high contrast ratio and a method of producing the same are disclosed, wherein while two glass substrates having patterned transparent electrodes are set obliquely at a first angle with respect to an evaporation source, then a first $SiO_2$ film is deposited on each of the glass substrates while irradiating the glass substrates with an ion beam emitted from an ion gun. Subsequently, the glass substrates are turned in their planes over an angle of 90 degrees and set obliquely at a second angle with respect to the evaporation source, and thereafter, a second $SiO_2$ film is deposited on the respective first $SiO_2$ films while irradiating the first $SiO_2$ film with the ion beam. The first and second $SiO_2$ films thus deposited on the glass substrates jointly form homeotropic-alignment undercoat films. A homeotropic alignment film is applied to each of the undercoat films, and after that the glass substrates are assembled together via spacers and filled with a liquid crystal.

16 Claims, 3 Drawing Sheets

LIQUID CRYSTAL DISPLAY DEVICE WITH HOMEOTROPIC ALIGNMENT LAYER UNDERCOAT FORMED BY ION BEAM ASSISTED VAPOR DEPOSITION OF OXIDE GAS

BACKGROUND OF THE INVENTION

1. Field of the Invention

The present invention relates to a homeotropic-alignment liquid crystal display device for use in a flat panel display, an optical computer, or a video projector, and a method of producing such homeotropic-alignment liquid crystal display device. More particularly, it relates to improvements in the display quality and mass production capability of the homeotropic-alignment liquid crystal display device.

2. Description of the Related Art

Homeotropic-alignment liquid crystal display devices, because of their sharp threshold in the V-T (voltage vs. transmission) characteristics and high contrast ratios, succeeded in providing high display qualities even when activated with a simple matrix driver. (SID 89 DIGEST, p378 (1989)).

In the homeotropic-alignment liquid crystal display devices, a nematic crystal liquid of negative dielectric anisotropy is used. Liquid crystal molecules homeotropically aligned with respect to substrate surfaces are caused to tilt by a drive voltage, whereupon a display operation begins. With this construction, if the molecule tilt direction is not uniform in the activated state, a remarkable brightness non-uniformity is observed. In order to avoid this phenomenon, a small pre-tilt angle is given when a liquid crystal homeotropic-alignment is achieved. However, as the pre-tilt angle increases, the difficulty in obtaining the homeotropic alignment increases. Likewise, the contrast ratio and the threshold level decrease with an increase in pre-tilt angle.

The pre-tilt angle may be given by using an angledeposited film, i.e., a film formed by an angle vapor deposition process also called as an oblique evaporation process. The angle vapor deposition process is an outstanding process used theretofore for aligning liquid crystal molecules, wherein the vapor of an oxide such as an SiO is deposited on a substrate surface from an oblique direction. However, when a small pre-tilt angle is given, if the drive voltage undergoes a sudden change, the liquid crystal molecules may tilt in diametrically opposite directions. This phenomenon is observed as a dynamic alignment defect. In order to solve this problem, a two-step angle vapor deposition process, such as disclosed in Japanese Patent Publication No. 55-13338, has been proposed as a process which is suitable for controlling the molecule tilt direction of the liquid crystal.

The above-mentioned angle vapor deposition process, however, has a problem that the pre-tilt angle varies greatly with a slight change in film thickness or incident angle. As is also reported in Proceedings of the SID, Vol. 31/4, p321 (1990), when the angle vapor deposition process is used in the production of liquid crystal light valves, a great change in the constant ratio is observed with a slight change in the pre-tilt angle. This phenomenon will bring about the occurrence of non-uniform liquid crystal alignment and an inadequate reproducibility problem. In addition, the SiO film or $SiO_x$ film is chemically unstable and hence involves an aging problem.

According to another alignment method disclosed in Japanese Patent Laid-open Publication No. 51-129251, an $SiO_2$ film deposited on a substrate is etched off by an Ar ion beam directed obliquely onto the $SiO_2$ film so as to produce a surface profile change which in turn is used for liquid crystal alignment. Due to a large etch-off amount, the disclosed alignment method is time-consuming.

In addition, a simple ion beam etching effected in an oblique direction is likely to cause an alignment non-uniformity problem in the activated state, which problem is particularly significant for a high resolution spatial light modulator constructed to display dynamic images.

SUMMARY OF THE INVENTION

With the foregoing drawbacks of the prior art in view, it is an object of the present invention to provide a photostable homeotropic-alignment liquid crystal display unit which is free from the occurrence of alignment non-uniformity both in the unactivated state and in the activated state, and has a high contrast ratio.

Another object of the present invention is to provide a method of making the photostable homeotropic-alignment liquid crystal display unit which makes it possible to use these materials which cannot be used in a conventional method, and is able to control adverse effects caused by variation of film thickness and incident light angle while maintaining an outstanding alignment effect attributed to the angle vapor deposition process.

According to a first aspect of the present invention, there is provided a homeotropic-alignment liquid crystal display device of the type having a glass substrate coated with a homeotropic-alignment undercoat film, characterized in that the homeotropic-alignment undercoat film is a film of oxide deposited on the substrate by ion beam assisted angle vapor deposition of an oxide gas.

According to a second aspect of the present invention, there is provided a method of producing a homeotropic-alignment liquid crystal display device of the type having a glass substrate coated with a homeotropic-alignment undercoat film, comprising the steps of:

providing a thin-film deposition system having an evaporation source and an ion source;

holding a glass substrate obliquely within the thin-film deposition system such that the normal line on the glass substrate and the evaporation source form a first angle, and the normal line on the glass substrate and the ion source form a second angle;

activating the evaporation source and the ion source, thereby forming a film of oxide deposited on the glass substrate by ion beam assisted angle vapor deposition of an oxide gas; and thereafter, again activating the ion source to irradiate the oxide film with an ion beam, the oxide film forming the homeotropic-alignment undercoat film.

According to a third aspect of the present invention, there is provided a method of producing a homeotropic-alignment liquid crystal display device of the type having a glass substrate coated with a homeotropic-alignment undercoat film, comprising the steps of:

providing a thin-film deposition system having an evaporation source and an ion source;

holding a glass substrate obliquely within the thin-film deposition system such that the normal line on the glass substrate and the evaporation source form a first angle, and the normal line on the glass substrate and the ion source form a second angle;

activating the evaporation source and the ion source, thereby forming a first film of oxide deposited on the glass substrate by ion beam assisted angle vapor deposition of an oxide gas;

thereafter, setting the glass substrate in a oblique position such that the normal line on the glass substrate and the evaporation source form a third angle; and subsequently, activating the evaporation source and the ion source again, thereby forming a second oxide film deposited on the first oxide film by ion beam assisted angle vapor deposition of the oxide gas, the first and second oxide films forming the homeotropic-alignment undercoat film.

Many other objects, advantages and features of the present invention will be better understood from the following description taken in conjunction with the accompanying drawings.

DETAILED DESCRIPTION OF THE INVENTION

The invention will be further described by way of the following examples which should be construed as illustrative rather than restrictive.

Figure 1:
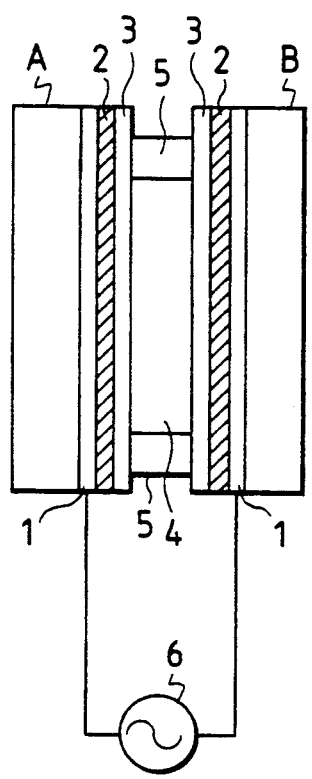
FIG. 1 is a diagrammatical view showing the general construction of a liquid crystal display device according to an embodiment of the present invention.

FIG. 1 shows the general construction of a liquid crystal display device according to the present invention. In FIG. 1, A and B are oppositely disposed glass substrates. The inside surface of each of the glass substrates A and B is laminated with a transparent electrode 1, an alignment undercoat film 2, and a homeotropic-alignment film 3 that are arranged in the order named. A liquid crystal 4 is filled in a space defined between the homeotropic-alignment films 3, 3. Numerals 5 are spacers, and 6 is a power supply.

Figure 2:
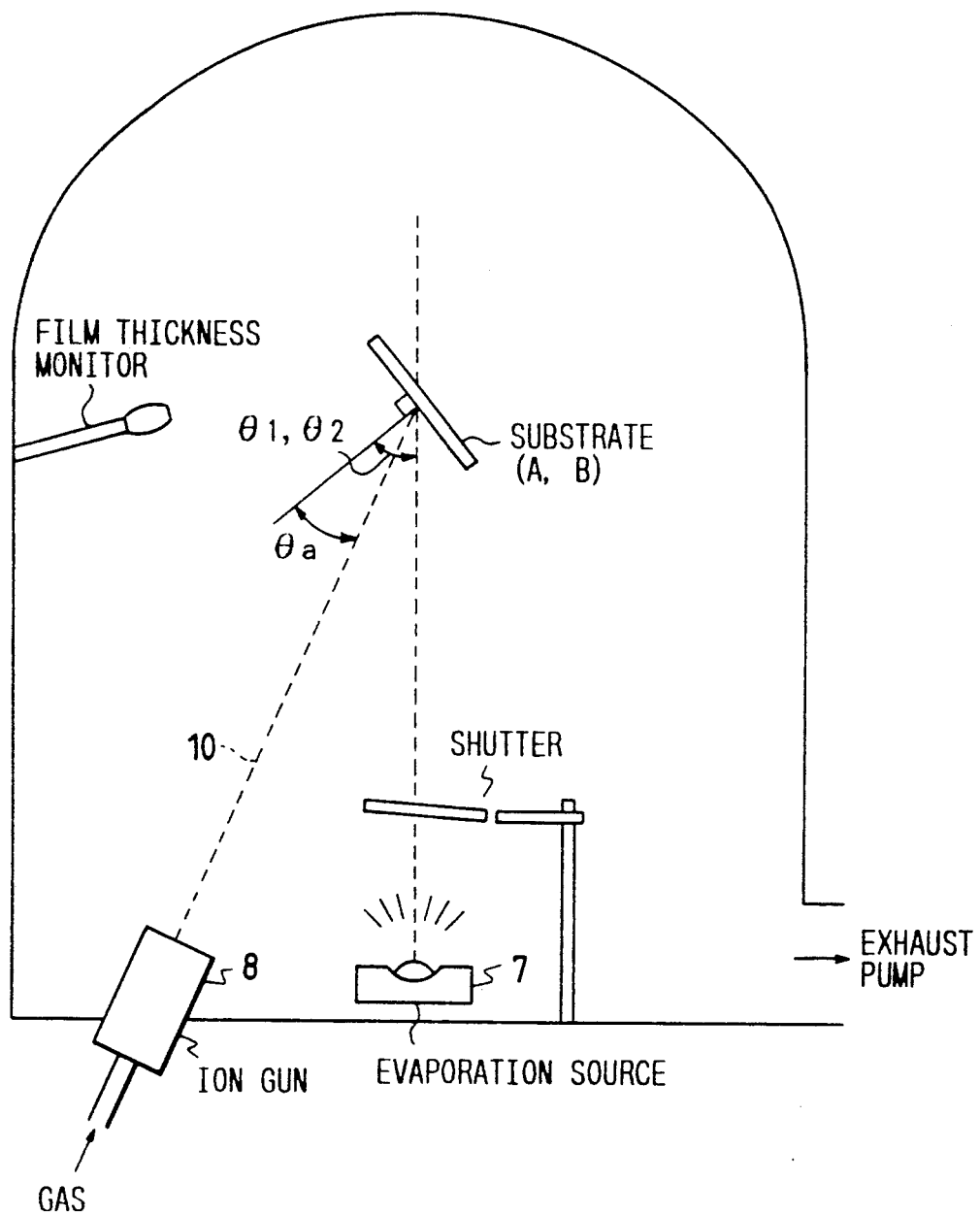
FIG. 2 is a diagrammatical view showing the construction of an apparatus for forming a film by an angle vapor deposition.

FIG. 2 shows a thin-film deposition system or apparatus used for forming an angle-deposited film according to the present invention.

EXAMPLE 1

Using the apparatus shown in FIG. 2, two glass substrates A, B each coated with a transparent electrode (indium tin oxide: ITO) treated by a desired patterning were set obliquely in the apparatus, with an angle $\theta_1$ formed between the normal line on each glass-ITO substrate A, B and an evaporation source 7, and a first $SiO_2$ film was deposited on the obliquely supported glass-ITO substrates A, B while irradiating the substrate surface with an ion beam 10 emitted from an ion gun 8. Conditions for a first step of ion beam assisted angle vapor deposition process were as follows.
Deposition Rate: 10 Å/sec.
Ion Beam Power: 500 V, 40 mA
Ionized Gas: $O_2$
Gas Pressure: $1.5-3.5 \times 10^{-5}$ Torr
Substrate Temperature: Room temperature
$\theta_1$: 50–60 degrees
$SiO_2$ Film Thickness: 100–500 Å

Thereafter, the substrates A, B were twisted or turned in a plane of the substrates A, B over an angle of 90° (in-plane rotation), and after that they were set in an oblique position, with an angle $\theta_2$ formed between the normal line on each substrate A, B and the evaporation source 7. Thereafter, a second $SiO_2$ film was deposited over the first $SiO_2$ film during that time the first $SiO_2$ film was irradiated with an ion beam 10 emitted from the ion gun 8. Conditions for the second step of ion beam assisted angle vapor deposition process were the same as those used in the first step of ion beam assisted vapor deposition process with the exception given below.
Deposition Rate: 2 Å/sec.
$\theta_2$: 75–85 degrees
$SiO_2$ Film Thickness: 25–50 Å

The glass-ITO substrates A, B overcoated with an alignment undercoat film 2 of a double-layer structure were thus produced.

Then, the glass-ITO substrates A, B coated with the alignment undercoat film 2 were coated with a homeotropic-alignment film 3. To form the homeotropic-alignment film 3, a homeotropic-alignment agent (AY43-021 available from the Dow Corning Toray Silicone Co., Ltd.) composed of a silan coupling agent was coated over the alignment undercoat film 2, followed by baking at 110° C. for 1 hour. The substrates A, B were then bonded together with spacers 5 disposed therebetween, and after that a liquid crystal (EN38 available from Chisso Corp.) was filled in a space defined between the substrates A, B and the spacers 5. Thus, a homeotropic-alignment liquid crystal display device or cells having a 6 μm cell thickness was produced. The foregoing procedure was repeated to produce eight sample cells (Sample Nos. 1–8) having different homeotropic-alignment undercoat film 2 sets.

COMPARATIVE EXAMPLE 1

For comparative purposes, two sample cells (Sample Nos. 9 and 10) were produced by repeating the procedure of Example 1 except that $\theta_1$ and $\theta_2$ were fixed at 60° and 85°, respectively, the two-step angle vapor deposition process was carried out without the assistance of ion beam irradiation, and the evaporation material used in the production of one sample cell (Sample No. 10) was SiO.

EXAMPLE 2

Two sample cells (Sample Nos. 11 and 12) were produced for comparative purposes by repeating the procedure of Example 1 except that $\theta_1$ and $\theta_2$ were fixed at 60° and 85°, respectively, and the in-plane rotation or twisting was omitted for one sample cell (Sample No. 11) while effected at a 180° angle for the other sample cell (Sample No. 12).

For purposes of performance evaluation, the sample cells (Sample Nos. 1–12) were measured for contrast ratio (CR) and $\gamma$ value. The CR is the ratio of the maximum intensity of transmitted light in the electric-field activated state to the intensity of transmitted light in the electric-field unactivated state under crossed Nicol prisms. The $\gamma$ value is the ratio of the applied voltage observed when the intensity of transmitted light becomes equal to 99% of the maximum, to the applied voltage observed when the intensity of transmitted light becomes equal to 1% of the maximum. The occurrence of alignment non-uniformity was also inspected visually. Results thus obtained are shown in Table 1. In Table 1, the mark "⦿" represents no alignment non-uniformity observed, "O" represents the alignment non-uniformity observed when a great change in applied voltage occurred, "Δ" represents the alignment non-uniformity occurred with a change in applied voltage, and "X" represents the alignment non-uniformity observed at all times.

TABLE 1

[Examples 1-2 and Comparative Example 1]

| Sample No. | Step 1 $\theta_1$ (°) | Step 1 Film Thickness (Å) | Step 2 $\theta_2$ (°) | Step 2 Film Thickness (Å) | CR | $\gamma$ | Uniformity | Note |
|---|---|---|---|---|---|---|---|---|
| 1 | 50 | 500 | 85 | 25 | 601 | 1.49 | Δ | |
| 2 | 55 | 500 | 85 | 25 | 700 | 1.55 | ⦿ | |
| 3 | 60 | 500 | 85 | 25 | 649 | 1.54 | ⦿ | |
| 4 | 50 | 250 | 85 | 25 | 570 | 1.64 | ⦿ | |
| 5 | 50 | 100 | 85 | 25 | 668 | 1.47 | Δ | |
| 6 | 60 | 500 | 80 | 25 | 647 | 1.60 | ⦿ | |
| 7 | 60 | 500 | 75 | 25 | 601 | 1.59 | ⦿ | |
| 8 | 60 | 500 | 85 | 50 | 650 | 1.55 | ⦿ | |
| 9 | 60 | 500 | 85 | 25 | — | — | X | *1 |
| 10 | 60 | 500 | 85 | 25 | 416 | 1.62 | ⦿ | *2 |
| 11 | 60 | 500 | 85 | 25 | 690 | 1.55 | ⦿ | *3 |
| 12 | 60 | 500 | 85 | 25 | 655 | 1.51 | ⦿ | *4 |

Note:
*1: ion beam assist omitted
*2: ion beam assist omitted, evaporation material = SiO
*3: without in-plane rotation
*4: with an 180° angle in-plane rotation It is evidenced from Table 1 that all of the sample cells (Sample Nos. 1-8 and 11-12) according to the present invention have contrast ratios (CR) which are considerably higher than those of the conventional cells (Sample Nos. 9 and 10), and excepting two samples (Sample Nos. 1 and 5), they are free from the alignment non-uniformity problem and have $\gamma$ values which are comparable to those of the conventional cells. This means that the performance characteristics of the inventive cells are stable and not influenced very much by changes in film thickness and incident angle. In addition, a comparison made between Sample No. 9 and other Samples indicates that the ion beam assist process makes it possible to use the $SiO_2$ as a material for forming an alignment film. This is particular advantageous because the $SiO_2$ has been considered as being highly chemically stable but inadequate as a material for the alignment film.

The in-plane rotation or twist made before the second angled vapor deposition step has no adverse effect on the CR, $\gamma$ and alignment non uniformity of the cells (See Sample Nos. 11 and 12). It was found that the in-plane rotation over a 0° angle or a 180° angle successfully controlled the off-state alignment non-uniformity and temperature-induced changes in alignment direction.

EXAMPLE 3

Using the apparatus shown in FIG. 2, two glass substrates A, B each coated with a transparent electrode (indium tin oxide: ITO) treated by a desired patterning were set obliquely in the apparatus, with an angle $\theta_1$ formed between the normal line on each glass-ITO substrate A, B and an evaporation source 7, and an $SiO_2$ film was deposited on the obliquely supported glass-ITO substrates A, B while irradiating the substrate surface with an ion beam 10 emitted from an ion gun 8. Conditions for the ion beam assisted angle vapor deposition process were as follows.
Deposition Rate: 10 Å/sec.
Ion Beam Power: 500 V, 40 mA
Ionized Gas: $O_2$
Gas Pressure $1.5-3.5 \times 10^{-5}$ Torr
Substrate Temperature: Room temperature
$\theta_1$: 50–60 degrees
$\theta_a$: 60–70 degrees
$SiO_2$ Film Thickness: 500 Å

Thereafter, the substrates A, B were twisted or turned in a plane of the substrates A, B over an angle of 90° and then set in an oblique position, with an angle $\theta_a$ formed between the normal line on each substrate A, B and the ion gun 8. Thereafter, the ion beam 10 of the same power as described above was irradiated over the $SiO_2$ film for 2 minutes.

The glass-ITO substrates A, B overcoated with an alignment undercoat film 2 of a single-layer structure were thus produced.

Then, the glass-ITO substrates A, B coated with the alignment undercoat film 2 were coated with a homeotropic-alignment film 3. To form the homeotropic-alignment film 3, a homeotropic-alignment agent (AY43-021 available from the Dow Corning Toray Silicone Co., Ltd.) composed of a silan coupling agent was coated over the alignment undercoat film 2, followed by baking at 110° C. for 1 hour. The substrates A, B were then bonded together with spacers 5 disposed therebetween, and after that a liquid crystal (EN38 available from Chisso Corp.) was filled in a space defined between the substrates A, B and the spacers 5. Thus, a homeotropic-alignment liquid crystal display device or cell was produced. The foregoing procedure was repeated to produce five sample cells (Sample Nos. 13-17) having different homeotropic-alignment undercoat film 2 sets.

EXAMPLE 4

For comparative purposes, a sample cell (Sample No. 18) was produced by repeating the procedure of Example 3 except that $\theta_1$ was fixed at 60°, and the second ion beam irradiation step was omitted.

EXAMPLE 5

Two sample cells (Sample Nos. 19 and 20) were produced for comparative purposes by repeating the procedure of Example 3 except that $\theta_1$ and $\theta_a$ were both fixed at 60°, and the in-plane rotation or twisting was omitted for one sample cell (Sample No. 19) while effected at a 180° angle for the other sample cell (Sample No. 20).

COMPARATIVE EXAMPLE 2

For comparative purposes, two sample cells (Sample Nos. 21 and 22) were produced by repeating the procedure of Example 1 except that $\theta_1$ and $\theta_2$ were fixed at 60° and 85°, respectively, the gas pressure was less than $2 \times 10^{-5}$ Torr, the two-step angle vapor deposition process was carried out without the assistance of ion beam irradiation, and the evaporation material used in the production of one sample cell (Sample No. 21) was SiO.

For purposes of performance evaluation, the sample cells (Sample Nos. 13-22) were measured for contrast ratio (CR) and γ value. The CR and the γ value are as specified above. The occurrence of alignment non-uniformity was also inspected visually. Results thus obtained are shown in Table 2. In Table 2, the marks "⦿," "O," "Δ" and "X" used for evaluation of the alignment uniformity are as specified above.

TABLE 2

[Examples 3-5 and Comparative Example 2]

| Sample No. | Angle VD $\theta_1$ (°) | Film Thickness (Å) | Ion Beam Irradiation $\theta_a$ (°) | CR | γ | Uniformity | Note |
|---|---|---|---|---|---|---|---|
| 13 | 50 | 500 | 60 | 601 | 1.49 | Δ | |
| 14 | 55 | 500 | 60 | 579 | 1.58 | ⦿ | |
| 15 | 60 | 500 | 60 | 516 | 1.60 | ⦿ | |
| 16 | 60 | 250 | 60 | 550 | 1.60 | ⦿ | |
| 17 | 60 | 500 | 70 | 585 | 1.55 | ◉ | |
| 18 | 60 | 500 | — | 169 | 2.5 | ⦿ | |
| 19 | 60 | 500 | 60 | 578 | 1.49 | | *5 |
| 20 | 60 | 500 | 60 | 556 | 1.51 | ◉ | *6 |
| 21 | 60 | 500 | — | 416 | 1.62 | ◉ | *7 |
| 22 | 60 | 500 | — | — | — | X | *8 |

Note:
*5: without in-plane rotation
*6: with an 180° angle in-plane rotation
*7: ion beam assist omitted, evaporation material = SiO
*8: ion beam assist omitted It is evidenced from Table 2 that omission of the second ion beam irradiation brings about a low CR and a large γ value which deteriorate the directivity of homeotropic-alignment (Sample No. 18). Excepting this No. 18, all the sample cells (Sample Nos. 13-17 and 19-20) according to the present invention have contrast ratios (CR) which are considerably higher than those of the conventional cells (Sample Nos. 21 and 22). Further, excepting one sample (Sample No. 13), they are free from the alignment non-uniformity problem and have γ values which are comparable to those of the conventional cells (Sample Nos. 21 and 22). This means that the performance characteristics of the inventive cells are stable and not influenced very much by changes in film thickness and incident angle. In addition, the Sample No. 22 when compared with other Samples indicates that the ion beam assist process makes it possible to use the $SiO_2$ as a material for forming an alignment film. As described previously, this is particular advantageous because the $SiO_2$ has been considered as being highly chemically stable but inadequate as a material for the alignment film.

The in-plane rotation or twist made before the second angled vapor deposition step has no adverse effect on the CR, γ and alignment non-uniformity of the cells (See Sample Nos. 19 and 20). It was found that the in-plane rotation over a 0° angle or a 180° angle successfully controlled the off-state alignment non-uniformity and temperature-induced changes in alignment direction.

EXAMPLE 6

Figure 3:
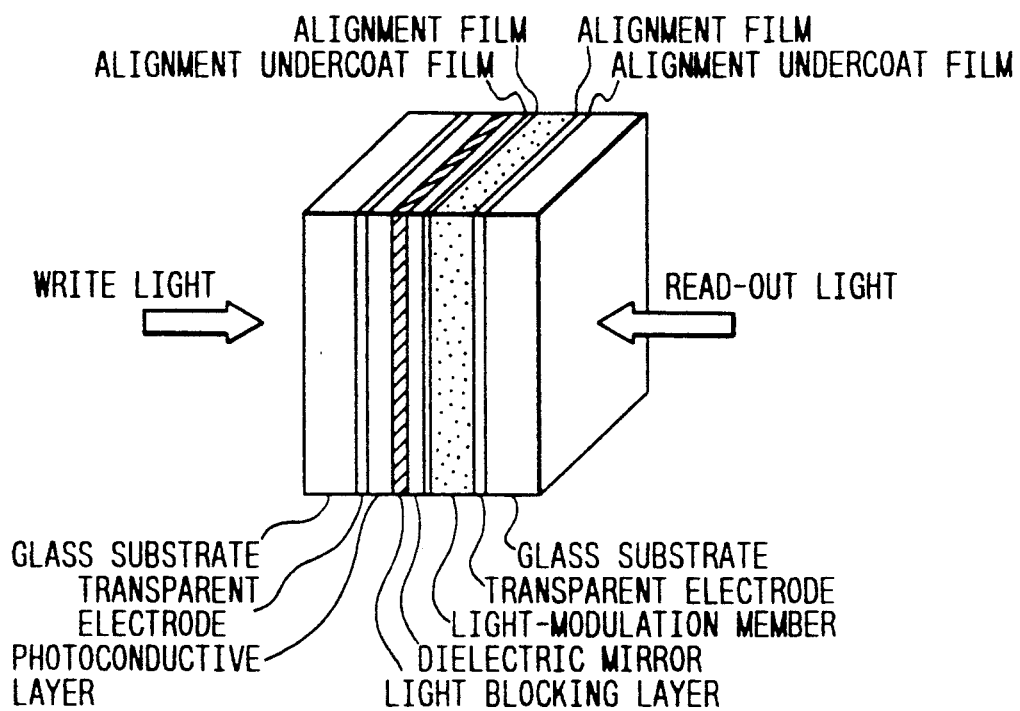
FIG. 3 is a diagrammatical view showing a liquid crystal display device according to an embodiment of the present invention.
Figure 4:
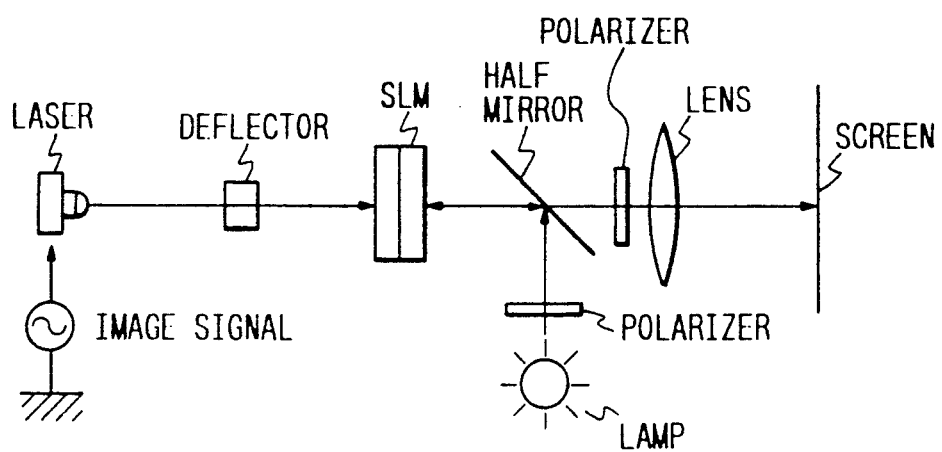
FIG. 4 is a diagrammatical view showing an optical projection system used for evaluation of the liquid crystal display device shown in FIG. 3.

A spatial light modulator (SLM) of a construction shown in FIG. 3 was produced and incorporated in an optical projection system shown in FIG. 4. Using this projection system, written images were projected as 50-times enlarged dynamic images on a screen for visual inspection of the display qualities.

The SLM was produced in a manner described below. Using a plasma chemical vapor deposition (CVD) system, a hydrogenerated amorphous silicon (a-Si:H) layer of 15 μm thick was deposited on a glass-ITO substrate as a photoconductive layer. Then, an Si film of 2 μm was formed by vapor deposition over the photoconductive layer, thus forming a light blocking layer. On the light blocking layer were laminated five layers of alternating $SiO_2$ and $TiO_2$ films with λ/4 unit layer thick so as to form a dielectric mirror.

Using the thus treated substrate in combination with a glass-ITO substrate, a cell (Sample A) was produced by repeating the procedure of Example 1 and under the conditions set for producing Sample No. 3 described above.

Another cell (Sample B) was produced by repeating the procedure of Example 3 and under the conditions set for producing Sample No. 15 described above.

The cells (Sample A and Sample B) were separately assembled with the optical projection system shown in FIG. 4, and the qualities of dynamic images projected on the screen were inspected visually No non-uniformity was observed by the visual inspection at the boundary between the bright and dark areas of the dynamic images, and hence the qualities of the displayed images were quite satisfactory.

Obviously, various minor changes and modifications of the present invention are possible in the light of the above teaching. For example, the evaporation material may include oxides other than $SiO_2$. Similarly, the ionized gas may include Ar, $Ar-O_2$ or the like. The present invention is not limited to reflection read out type liquid crystal display devices but also applicable to the transmission type liquid crystal display devices It is therefore to be understood that within the scope of the appended claims the invention may be practiced otherwise than as specifically described.

What is claimed is:

1. A homeotropic-alignment liquid crystal display device of the type having a glass substrate coated with a homeotropic-alignment undercoat film, characterized in that said homeotropic-alignment undercoat film is a film of oxide deposited on the substrate by ion beam assisted angle vapor deposition of an oxide gas.

2. A homeotropic-alignment liquid crystal display device according to claim 1, wherein said oxide film is an $SiO_2$ film.

3. A homeotropic-alignment liquid crystal display device according to claim 1, wherein said oxide film is composed of a first oxide layer deposited in a first direction and a second oxide layer deposited over said first oxide layer in a second direction, said first direction and second direction forming an angle in a plane parallel to the glass substrate.

4. A homeotropic-alignment liquid crystal display device according to claim 3, wherein said angle is 90 degrees.

5. A homeotropic-alignment liquid crystal display device according to claim 1, wherein said oxide film is composed of a first oxide layer deposited in a first direction and a second oxide layer deposited over said first oxide layer in a second direction which is diametrically opposite to said first direction.

6. A method of producing a homeotropic-alignment liquid crystal display device of the type having a glass substrate coated with a homeotropic-alignment undercoat film, comprising the steps of:

providing a thin-film deposition system having an evaporation source and an ion source;

holding a glass substrate obliquely within the thin-film deposition system such that a line normal to the glass substrate and the evaporation source form a first angle;

activating the evaporation source and the ion source, thereby forming a film of oxide deposited on the glass substrate by ion beam assisted angle vapor deposition of an oxide gas; and thereafter, again activating the ion source to irradiate said oxide film with an ion beam such that a line to the glass substrate and the ion source form a second angle, said oxide film forming the homeotropic-alignment undercoat film.

7. A method according to claim 6, wherein said first angle is in the range of from 55 to 60 degrees, and said second angle is in the range of from 60 to 70 degrees.

8. A method according to claim 6, wherein said ion beam irradiation of said oxide film continues for 2 minutes.

9. A method according to claim 6, wherein before said oxide film is irradiated with the ion beam, the glass substrate is turned in its plane over an angle of 180 degrees.

10. A method according to claim 6, wherein before said oxide film is irradiated with the ion beam, the glass substrate is turned in its plane over an angle of 90 degrees.

11. A method according to claim 6, wherein said oxide film is an $SiO_2$ film.

12. A method of producing a homeotropic-alignment liquid crystal display device of the type having a glass substrate coated with a homeotropic-alignment undercoat film, comprising the steps of:

providing a thin-film deposition system having an evaporation source and an ion source;

holding a glass substrate obliquely within the thin-film deposition system such that a line normal to the glass substrate and the evaporation source form a first angle;

activating the evaporation source and the ion source, thereby forming a first film of oxide deposited on the glass substrate by ion beam assisted angle vapor deposition of an oxide gas;

thereafter, setting the glass substrate in a oblique position such that the line normal to the glass substrate and the evaporation source form a second angle; and subsequently, activating the evaporation source and the ion source again, thereby forming a second oxide film deposited on said first oxide film by ion beam assisted angle vapor deposition of the oxide gas, said first and second oxide films forming the homeotropic alignment undercoat film.

13. A method according to claim 12, wherein said first angle is in the range of from 55 to 60 degrees, and said second angle is in the range of from 75 to 85 degrees.

14. A method according to claim 12, wherein before the evaporation source and the ion source are activated again, the glass substrate is turned in its plane over an angle of 180 degrees.

15. A method according to claim 12, wherein before the evaporation source and the ion source are activated again, the glass substrate is turned in its plane over an angle of 90 degrees.

16. A method according to claim 12, wherein said first and second oxide films are $SiO_2$ films.

* * * * *